United States Patent
Tamaki et al.

(10) Patent No.: US 11,282,996 B2
(45) Date of Patent: Mar. 22, 2022

(54) THERMOELECTRIC CONVERSION MATERIAL AND METHOD OF OBTAINING ELECTRICAL POWER USING THERMOELECTRIC CONVERSION MATERIAL

(71) Applicant: Panasonic Intellectual Property Management Co., Ltd., Osaka (JP)

(72) Inventors: Hiromasa Tamaki, Osaka (JP); Tsutomu Kanno, Kyoto (JP); Hiroki Sato, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/117,181

(22) Filed: Dec. 10, 2020

(65) Prior Publication Data

US 2021/0091290 A1    Mar. 25, 2021

Related U.S. Application Data

(63) Continuation of application No. PCT/JP2019/015882, filed on Apr. 12, 2019.

(30) Foreign Application Priority Data

Oct. 17, 2018    (JP) ............... JP2018-196056

(51) Int. Cl.
*C22C 24/00* (2006.01)
*H01L 35/18* (2006.01)

(52) U.S. Cl.
CPC .............. *H01L 35/18* (2013.01); *C22C 24/00* (2013.01)

(58) Field of Classification Search
CPC ................ C22C 24/00; H01L 35/18
See application file for complete search history.

(56) References Cited

U.S. PATENT DOCUMENTS

2016/0156068 A1   6/2016   Burke et al.

FOREIGN PATENT DOCUMENTS

JP    2016-535392    11/2016

OTHER PUBLICATIONS

International Search Report of PCT application No. PCT/JP2019/015882 dated Jul. 16, 2019.
Gen-Tao Zhou et al., "Microwave-assisted solid-state synthesis and characterization of intermetallic compounds of Li3Bi and Li3Sb", Journal of Materials Chemistry, 13, pp. 2607-2611, (2003).
Chris G. Van de Walle et al., "First-principles calculations for defects and impurities: Applications to III-nitrides", Journal of Applied Physics, vol. 95, No. 8, pp. 3851-3879, (2004).
Yukinori Koyama et al., "First principles study of dopant solubility and defect chemistry in LiCoO2", Journal of Materials Chemistry A, 2, pp. 11235-11245, (2014).
Georg K. H. Madsen et al., "BoltzTraP. A code for calculating band-structure dependent quantities", Computer Physics Communications, vol. 175, pp. 67-71, (2006).
Heng Wang et al., "Chapter 1, Material Design Considerations Based on Thermoelectric Quality Factor", in Thermoelectric Nanomaterials, eds. K. Koumoto and T. Mori, Springer, Berlin Heidelberg, vol. 182, ch. 1, pp. 3-32, (2013).
Jianming Chen et al., "First-Principles Predictions of Thermoelectric Figure of Merit for Organic Materials: Deformation Potential Approximation", Journal of Chemical Theory and Computation, 8, pp. 3338-3347, (2012).
Jun Yan et al., "Material descriptors for predicting thermoelectric performance", Energy & Environmental Science, 8, pp. 983-994, (2015).
Sean M. McDeavitt, "Synthesis and casting of a lithium-bismuth compound for an ion-replacement electrorefiner", Light Metals (Warrendale, Pennsylvania), pp. 1139-1142, (1999).

*Primary Examiner* — Jessee R Roe
(74) *Attorney, Agent, or Firm* — McDermott Will & Emery LLP

(57) ABSTRACT

A thermoelectric conversion material has a composition represented by the chemical formula $Li_{3-a}Bi_{1-b}Sn_b$, in which the range of values a and b is: $0 \le a < 0.0003$, and $-a+0.0003 \le b \le 0.016$; or $0.0003 \le a \le 0.085$, and $0 < b \le \exp[-0.079 \times (\ln(a))^2 - 1.43 \times \ln(a) - 10.5]$, and in which the thermoelectric conversion material has a $BiF_3$-type crystal structure and has a p-type polarity.

3 Claims, 3 Drawing Sheets

THERMOELECTRIC CONVERSION MATERIAL AND METHOD OF OBTAINING ELECTRICAL POWER USING THERMOELECTRIC CONVERSION MATERIAL

BACKGROUND

1. Technical Field

The present disclosure relates to a thermoelectric conversion material and a method of obtaining electrical power using a thermoelectric conversion material.

2. Description of the Related Art

When a temperature difference is provided between two ends of a thermoelectric conversion material, an electromotive force that is proportional to the temperature difference is generated. This phenomenon, in which heat energy is converted into electrical energy, is known as the Seebeck effect. In thermoelectric power generation technology, heat energy is directly converted into electrical energy by using the Seebeck effect.

As well known in the technical field of thermoelectric conversion materials, the performance of a thermoelectric conversion material used in a thermoelectric conversion device is evaluated by a figure of merit ZT. The ZT is represented by the following formula (I):

$$ZT = S^2 \sigma T/\kappa \qquad (I)$$

where S is the Seebeck coefficient of a material, a is the electrical conductivity of the material, and x is the thermal conductivity κ. The higher the ZT value, the higher the thermoelectric conversion efficiency.

Non-patent Literature 1 (Gen-Tao Zhou et al., "Microwave-assisted solid-state synthesis and characterization of intermetallic compounds of Li$_3$Bi and Li$_3$Sb", Journal of Materials Chemistry, 13, p. 2607-2611, (2003)) and Non-patent Literature 8 (Sean M. McDeavitt, "Synthesis and casting of a lithium-bismuth compound for an ion-replacement electrorefiner", Light Metals (Warrendale, Pa.), pp. 1139-1142, (1999)) each disclose a method of producing a Li$_3$Bi crystalline substance.

SUMMARY

One non-limiting and exemplary embodiment provides a novel thermoelectric conversion material.

In one general aspect, the techniques disclosed here feature a thermoelectric conversion material having a composition represented by the chemical formula Li$_{3-a}$Bi$_{1-b}$Sn$_b$, in which the thermoelectric conversion material has a BiF$_3$-type crystal structure and has a p-type polarity, and in which one of the following formulas (I) and (II) is satisfied: $0 \leq a < 0.0003$, and $-a + 0.0003 \leq b \leq 0.016$ (I); and $0.0003 \leq a \leq 0.085$, and $0 < b \leq \exp[-0.079 \times (\ln(a))^2 - 1.43 \times \ln(a) - 10.5]$ (II).

The present disclosure provides a novel thermoelectric conversion material.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Embodiments of the present disclosure will be described below with reference to the drawings.

A thermoelectric conversion material according to the present disclosure has a composition represented by the following chemical formula (I):

$$Li_{3-a}Bi_{1-b}Sn_b \qquad (I).$$

Figure 1:
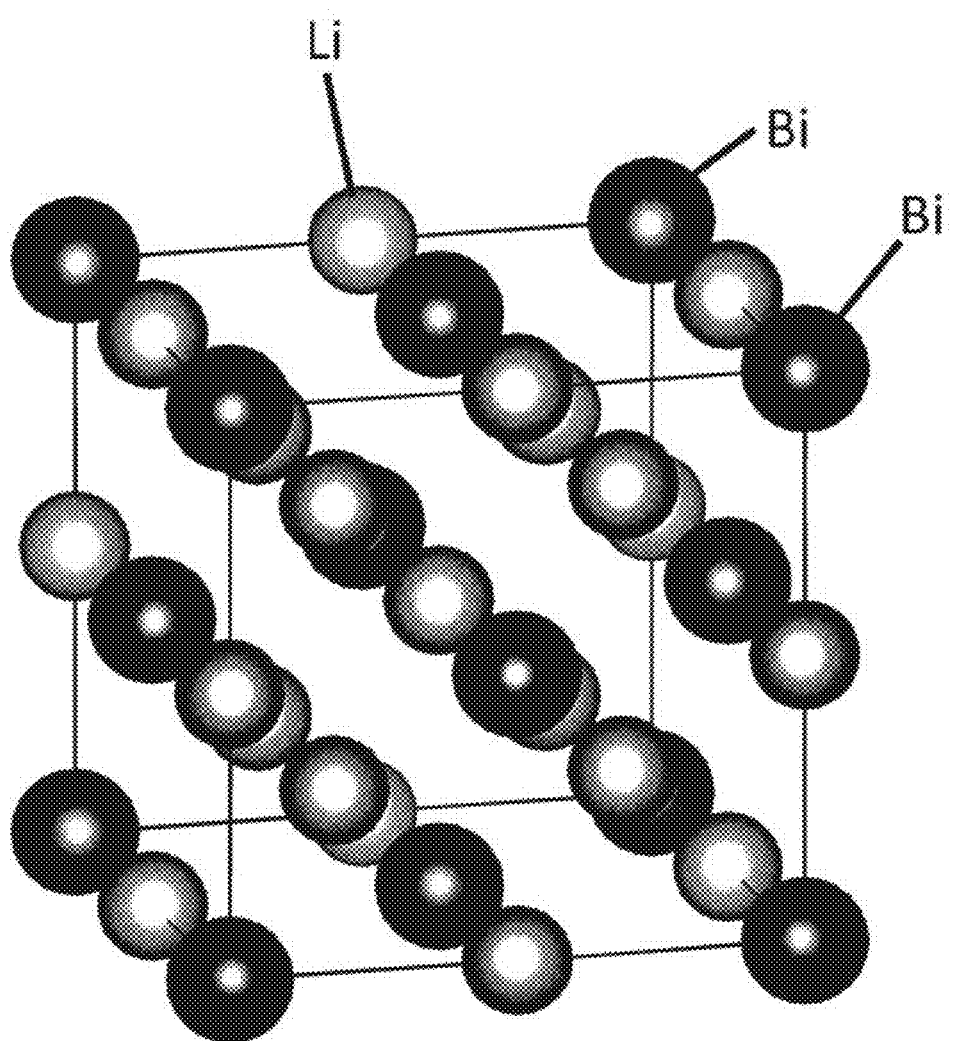
FIG. 1 is a schematic diagram showing a crystal structure of Li$_3$Bi.

FIG. 1 is a schematic diagram of a crystal structure of Li$_3$Bi. As is also disclosed in Non-patent Literature 1, the crystal structure of Li$_3$Bi includes a BiF$_3$-type crystal structure or an AlCu$_2$Mn-type crystal structure. Both the BiF$_3$-type crystal structure and the AlCu$_2$Mn-type crystal structure belong to the space group Fm-3m. In Non-patent Literature 1 and Non-Patent Literature 8, the Li$_3$Bi crystalline substance is not treated as a thermoelectric conversion material. Therefore, Non-patent Literature 1 and Non-Patent Literature 8 do not disclose a figure of merit ZT.

By using a material search method based on data science, referred to as material informatics, the present inventors calculated predictive values of figures of merit ZT on tens of thousands of compounds contained in the Inorganic Crystal Structure Database. A prediction model for the figure of merit ZT, which was independently established by the present inventors, was used in the calculation. This prediction model has higher accuracy than existing methods. Therefore, by using this prediction model, it is possible to obtain prediction results that are more reliable than existing ones. Accordingly, the present inventors studied whether or not a Li$_3$Bi crystalline substance, which had not been treated as a thermoelectric conversion material, was a promising material as a thermoelectric conversion material.

When a Li$_3$Bi crystalline substance is in a state of not having defects, the Li$_3$Bi crystalline substance lacks carriers. Therefore, a defectless Li$_3$Bi crystalline substance cannot be expected to have a high figure of merit ZT. Accordingly, in order to improve the figure of merit ZT, the present inventors studied to introduce defects into a Li$_3$Bi crystalline substance to generate p-type carriers. As a result, the present inventors hit upon two types of materials: a material having defects caused by substitution of the Li site by vacancies, and a material having defects caused by substitution of the Bi site by the element Sn.

The present inventors made calculations and deduced a range of values a and b in which the Li$_{3-a}$Bi$_{1-b}$Sn$_b$ crystalline substance only can be stably obtained. Furthermore, by calculating figures of merit ZT in the range, the present inventors found a range of values a and b in which a high figure of merit ZT of 0.4 or more can be obtained. Specifically, as verified in Examples 1 to 10, Comparative Examples 1 to 3, and Reference Examples 1 to 4, which will be described later, the thermoelectric conversion material has a high figure of merit ZT of 0.4 or more when one of the following formulas (I) and (II) is satisfied:

$$0 \leq a \leq 0.0003, \text{and } -a+0.0003 \leq b \leq 0.016 \quad (\text{I}); \text{ and}$$

$$0.0003 \leq a \leq 0.085, \text{ and } 0 \leq b \leq \exp[-0.079 \times (\ln(a))^2 - 1.43 \times \ln(a) - 10.5] \quad (\text{II}).$$

Specifically, in the range of values a and b described above, the figure of merit ZT is 0.44 or more. Refer to Table 1.

(Production Method)

An example of a method of producing a thermoelectric conversion material according to the present disclosure will be described below on the basis of the disclosures of Non-patent Literature 1 and Non-patent Literature 8.

Non-patent Literature 1 discloses a method of producing a $Li_3Bi$ crystalline substance. In the production method disclosed in Non-patent Literature 1, first, in an argon gas-filled glove box, a Li foil and granular Bi, at a molar ratio of 43:12, are placed in an alumina crucible. Then, the Li foil and the granular Bi are pressed together inside the crucible. The crucible is placed into a carbon-coated quartz tube. The inside of the quartz tube is evacuated to a degree of vacuum of $6.67 \times 10^{-3}$ Pa. The quartz tube is sealed using an oxygen gas flame. The sealed quartz tube is placed in a microwave cavity and is irradiated with microwave. In this way, a $Li_3Bi$ crystalline substance is obtained. The quartz tube is unsealed in the glove box, and the resulting $Li_3Bi$ crystalline substance is taken out of the quartz tube.

Non-patent Literature 8 also discloses a method of producing a $Li_3Bi$ crystalline substance. In the production method disclosed in Non-patent Literature 8, first, a tantalum crucible is accommodated in an induction casting furnace connected to an inert-gas-filled glove box. Li and Bi, at a molar ratio Li:Bi of 3:1, are introduced into the crucible. The inside of the furnace is heated slowly. As the inside of the furnace is heated, first, Li is melted. After melting of Li, Bi is melted. Thus, a reaction between Li and Bi proceeds to obtain a reaction product. The resulting reaction product is heated to 1,200° C. and homogenized. Then, the reaction product is cooled, and a $Li_3Bi$ crystalline substance is obtained.

In both of the production methods disclosed in Non-patent Literature 1 and Non-patent Literature 8, the deficient amount of Li can be controlled by changing the amount of Li as a starting material relative to the amount of Bi.

Furthermore, there is no big difference between the atomic radius of the element Bi (0.156 nm) and the atomic radius of the element Sn (0.140 nm). Therefore, it is considered that by adding Sn as a starting material, the element Bi can be partially substituted by the element Sn. The substitution amount by Sn can be controlled by changing the amount of Sn as a starting material relative to the amount of Bi.

For the reasons described above, it is considered that the $Li_{3-a}Bi_{1-b}Sn_b$ crystalline substance according to the present disclosure can be produced with reference to the production method disclosed in Non-patent Literature 1 or Non-patent Literature 8.

(Method of Obtaining Electrical Power Using Thermoelectric Conversion Material)

In this embodiment, by applying a temperature difference to the $Li_{3-a}Bi_{1-b}Sn_b$ crystalline substance according to the present disclosure, electrical power can be obtained.

Examples

The thermoelectric conversion material according to the present disclosure will be described in more detail with reference to the examples below.

(Analysis of Crystal Structure)

Figure 2:
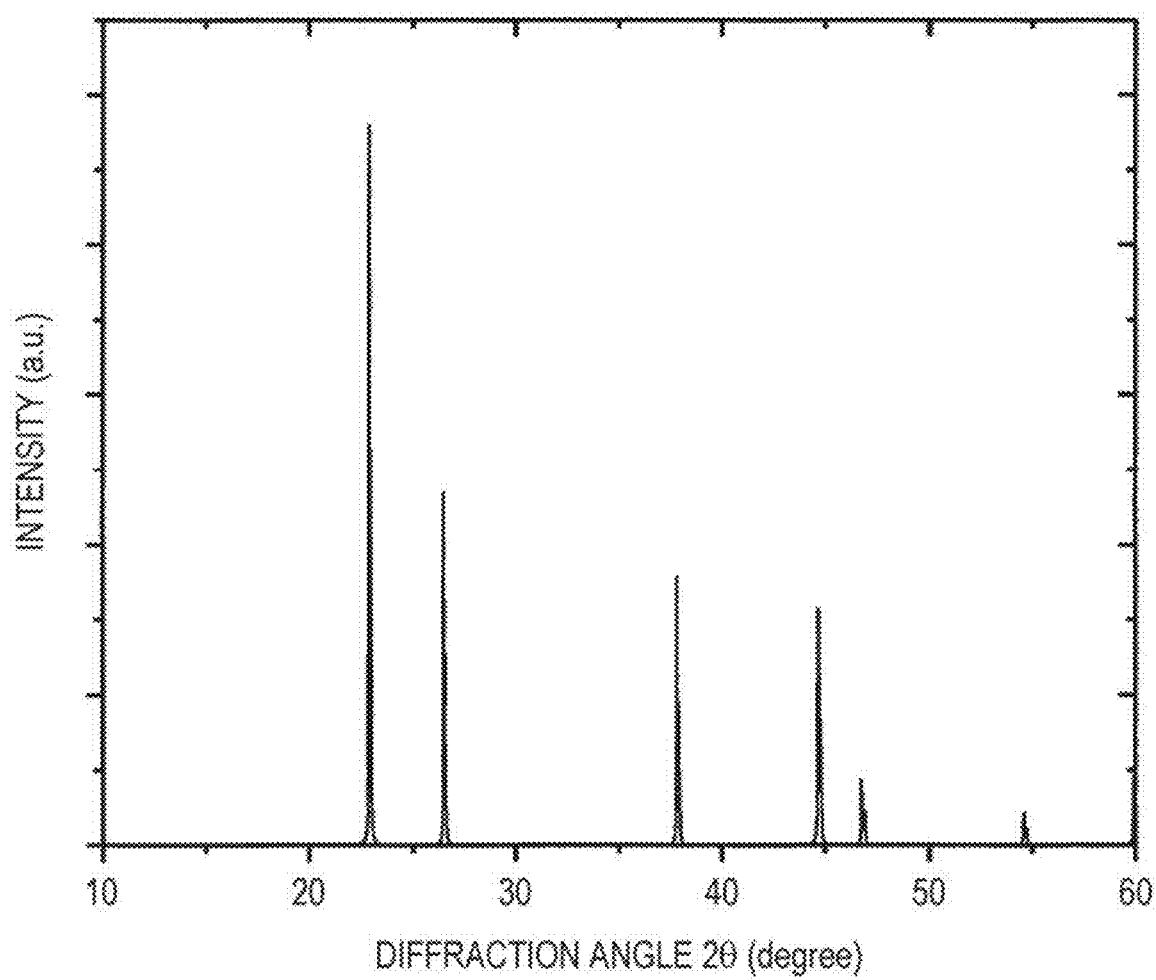
FIG. 2 is a graph showing a diffraction X-ray intensity distribution of a crystal structure of Li$_3$Bi.

Non-patent Literature 1 discloses that the crystal structure of a $Li_3Bi$ crystalline substance belongs to a $BiF_3$-type structure. The X-ray diffraction peaks of the $BiF_3$-type structure can be confirmed on the basis of measurement by an X-ray crystal diffraction method. FIG. 2 is a graph showing a diffraction X-ray intensity distribution of a crystal structure of $Li_3Bi$ obtained, using software (RIETAN, source URL: http://fujioizumi.verse.jp/download/download.html), by calculating the crystal structure factor F and integrated diffraction intensity I of $Li_3Bi$.

The crystal structure factor F was obtained by the following relational expression (1):

$$F = \Sigma f_i \exp(2\pi i r_i \Delta k) \quad (1)$$

where $r_i$ is the position vector of an atom in a crystal, $f_i$ is the atomic scattering factor of an atom at a position $r_i$, and $\Delta k$ is the difference in X-ray wave vector before and after scattering.

The integrated diffraction intensity I was obtained by the following relational expression (2):

$$I = I_e L |F|^2 N^2 \quad (2)$$

where $I_e$ is the scattering intensity of an electron, N is the number of unit lattices in a crystal, and L includes the suction factor and is the coefficient dependent on experimental conditions.

The thermoelectric conversion material according to the present disclosure has defects caused by partial substitution of the element Li site by vacancies or defects caused by partial substitution of the element Bi by the element Sn in a $Li_3Bi$ crystal. The defects can cause lattice deformation in the crystal structure. Therefore, it is expected that peaks in a diffraction X-ray intensity distribution of the thermoelectric conversion material according to the present disclosure may be slightly shifted from the peaks of the $Li_3Bi$ crystalline substance shown in FIG. 2 and disclosed in Non-patent Literature 1.

(Stable Composition Range Calculation Method)

The present inventors calculated the band structure of the $Li_3Bi$ crystalline substance by calculations based on the density functional theory (hereinafter, referred to as "DFT"). As a result, the present inventors had conclusion that the $Li_3Bi$ crystalline substance is a semiconductor. In the calculations based on DFT, the present inventors used the first-principles electronic structure calculation program (Vienna Ab initio Simulation Package, source: https://www.vasp.at/). This program is, hereinafter, referred to as "VASP".

In order to maximize the figure of merit ZT, it is needed to introduce defects into a semiconductor to generate p-type or n-type carriers. By generating carriers, it is expected that a large electromotive force will be obtained when a temperature difference is provided between two ends of a thermoelectric conversion material. It is not obvious what types of defects will need to be introduced to obtain a high carrier concentration. In order to enhance the figure of merit ZT, it is needed to find types of defects that enable a high carrier concentration.

The $Li_3Bi$ crystalline substance disclosed in each of Non-patent Literature 1 and Non-patent Literature 8 does not have defects and thus lacks carriers. Therefore, the $Li_3Bi$ crystalline substance cannot be expected to have a high figure of merit ZT. In order to enhance the figure of merit ZT, the present inventors studied about, for example, defects that might generate vacancies in the crystal structure of $Li_3Bi$, or substitution by other elements.

As defects for generating p-type carriers, the present inventors studied about two types of defects: (I) defects that generate vacancies in the crystal structure of $Li_3Bi$, and (II) defects caused by substitution of the element Bi by other elements. This study was performed by the present inventors on the assumption that, even when the defects were introduced into the crystal structure of $Li_3Bi$, the $BiF_3$-type structure was maintained. In other words, in the following calculation targets, the present inventors assumed that each crystal structure had the $BiF_3$-type structure.

Regarding defects that generate vacancies in the crystal structure of $Li_3Bi$, the defect formation energy $E_{form}$ when vacancies are generated in the Li site and the defect formation energy $E_{form}$ when vacancies are generated in the Bi site were calculated.

As a result, the present inventors found that the p-type carrier concentration is high when vacancies are generated in the Li site, while the p-type carrier concentration is low when vacancies are generated in the Bi site. The defect formation energy $E_{form}$ will be described in detail later.

Regarding defects caused by substitution of the element Bi by other elements, as the candidates for the other elements, the present inventors tried to use elements Sn, Ga, and Pb. The present inventors selected the elements Sn, Ga, and Pb from the viewpoint that each of them has a smaller valence than that of the element Bi and that there is no big difference in ionic radius between each of them and the element Bi. The present inventors calculated the defect formation energy $E_{form}$ of the crystal structure of $Li_3Bi$ in which Bi was partially substituted by any one of Sn, Ga, and Pb.

As a result, the present inventors found that the p-type carrier concentration is high when substituted by the element Sn, while the p-type carrier concentration is low when substituted by the element Ga or Pb.

On the basis of the above considerations, as the defects that generate p-type carriers, the present inventors hit upon two types: defects that generate vacancies in the Li site, and defects caused by substitution of the element Bi by the element Sn.

The present inventors calculated the stable composition range of $Li_{3-a}Bi_{1-b}Sn_b$ according to the present disclosure. The term "stable composition range" means a composition range in which a single crystal phase can be obtained and two or more crystal phases are not formed. Hereinafter, the "single crystal phase" is referred to as the "single phase". The stable composition range of $Li_{3-a}Bi_{1-b}Sn_b$ means a composition range in which the $Li_{3-a}Bi_{1-b}Sn_b$ crystalline substance only can be obtained. Outside this range, in addition to the $Li_{3-a}Bi_{1-b}Sn_b$ crystalline substance, crystal phases of other compositions are precipitated, and a single-phase $Li_{3-a}Bi_{1-b}Sn_b$ crystalline substance cannot be obtained.

The stable composition range was calculated on the basis of the contents disclosed in Non-patent Literature 2 (C. G. Van de Walle et al., "First-principles calculations for defects and impurities: Applications to III-nitrides", Journal of Applied Physics, 95, p. 3851-3879, (2004)) and Non-patent Literature 3 (Y. Koyama et al., "First principles study of dopant solubility and defect chemistry in $LiCoO_2$", Journal of Materials Chemistry A, 2, p. 11235-11245, (2014)).

Specifically, first, in $Li_{3-a}Bi_{1-b}Sn_b$, the range of values a and b in which the $BiF_3$-type crystal structure was stabilized was calculated by a method based on the theory of defect formation in semiconductors disclosed in Non-patent Literature 2.

The defect formation energy $E_{form}$ in $Li_3Bi$ was evaluated on the basis of the following relational expression (3):

$$E_{form}(\mu_i, q, E_F) = E_{defect} - E_{pure} - \tau n_i \mu_i + q(E_{VBM} + E_F) \quad (3)$$

where $E_{defect}$ is the total energy when defect is present, $E_{pure}$ is the total energy of perfect crystal without defect, $n_i$ is the amount of increase or decrease of constituent element i due to defect, $\mu_i$ is the chemical potential of element i, q is the charge state of defect, $E_{VBM}$ is the energy of an electron at the valence band maximum of $Li_3Bi$ which is a semiconductor, and $E_F$ is the Fermi energy of electron.

These energy values were evaluated by applying DFT calculations within a range of generalized gradient approximation. Note that the $E_{form}$ was calculated in consideration of the pattern in which vacancies were generated in the Li site and the pattern in which Bi was substituted by Sn.

By using the defect formation energy $E_{form}$ obtained by the relational expression (3), the volume density No of each defect was evaluated on the basis of the following relational expression (4) in accordance with the Boltzmann distribution:

$$N_D(\mu_i, q, E_F) = N_{site} \times \exp[-E_{form}(\mu_i, q, E_F)/k_b T] \quad (4)$$

where $N_{site}$ is the volume density of the site in which the defect in consideration can be formed, $k_b$ is the Boltzmann constant, and T is the absolute temperature.

The charge-neutral condition in which the total amount of the charge of each defect $q \times N_D$ and the charge $Q_e$ of carrier doped into a semiconductor is 0 is always satisfied. On the basis of the charge-neutral condition, the Fermi energy and the carrier concentration were determined in each composition. At that time, the carrier concentration p of the valence band and the carrier concentration n of the conduction band were obtained from the following relational expressions (5) to (7):

$$p = 1 - \int D_{VB}(E)[1 - f(E; E_F)]dE \quad (5)$$

$$n = \int D_{CB}(E)f(E; E_F)dE \quad (6)$$

$$f(E; E_F) = 1/[\exp((E - E_F)/K_B T) + 1] \quad (7)$$

where $D_{VB}(E)$ and $D_{CB}(E)$ are the electron state density of the valence band and the electron state density of the conduction band, respectively, obtained by DFT calculations; $f(E; E_F)$ is the Fermi distribution function; and T is the absolute temperature at which thermoelectric conversion characteristics are evaluated. The charge density of all carriers Qe was calculated in accordance with the formula $Qe = e \times (n-p)$, where e is the charge possessed by one electron.

By using the same method as that of Non-patent Literature 3, the present inventors calculated the range in which the chemical potential $\mu_i$ of each element was allowed. Furthermore, the range of defect density was calculated by the relational expression (4). On the assumption that the range in which metal Li, metal Bi, or LiBi is formed is a range in which the crystal structure is not stabilized, the chemical potential range in which a single-phase $Li_{3-a}Bi_{1-b}Sn_b$ crystalline substance is obtained is set as a range excluding the range in which the crystal structure is not stabilized. Within the obtainable chemical potential range, the present inventors evaluated the defect density and its related chemical formula composition. The composition was determined as a function of the chemical potential of each element. For example, under certain chemical potential conditions, in the case where 5% of all Li sites in the $Li_3Bi$ crystal becomes deficient to form vacancies, the composition is $Li_{2.85}Bi$.

On the basis of the method described above, the present inventors evaluated allowed chemical potential ranges for the Li atom, the Bi atom, and the Sn atom of $Li_{3-a}Bi_{1-b}Sn_b$. Within the chemical potential ranges, the present inventors evaluated the density of defects that generated vacancies in the Li site and the density of defects caused by substitution of the Bi site by the element Sn.

Regarding the $Li_{3-a}Bi$ crystalline substance, the calculation results showed that a single-phase BiF-type crystal can be obtained in the range of 0 a≤0.654.

Regarding the $Li_3Bi_{1-b}Sn_b$ crystalline substance, the calculation results showed that a single-phase $BiF_3$-type crystal can be obtained in the range of 0≤b≤0.016.

Regarding the $Li_{3-a}Bi_{1-b}Sn_b$ crystalline substance, ranges in which a single-phase $BiF_3$-type crystal can be obtained in the range of 0 a 0.085 and 0≤b≤0.016 were calculated. As a result, calculations showed that a single-phase $BiF_3$-type crystal can be obtained in the ranges of (i) 0≤a≤0.0003, and 0≤b≤0.016, and (ii) 0.0003≤a≤0.085, and 0≤b≤exp[−0.079× $(ln(a))^2$−1.43×ln(a)−10.5].

The formula b=exp[−0.079×$(ln(a))^2$−1.43×ln(a)−10.5] was obtained by computing a smooth fitting curve connecting four points: (a, b)=(0.0003, 0.016), (0.012, 0.008), (0.030, 0.003), and (0.085, 0.0001). Under chemical equilibrium, two types of defect concentrations a and b are bound by the law of mass action represented by $a^A b^B$=equilibrium constant. The fitting curve in which ln(b) is expressed by the quadratic polynomial on ln(a), within a narrow composition range, is based on the law of mass action, i.e., the presence of linear relationship between ln(a) and ln(b). Note that these four points correspond to compositions of solubility limits in the range of a and b in which a single-phase $Li_{3-a}Bi_{1-b}Sn_b$ crystalline substance is obtained.

As will be described later, although a single-phase $Li_{3-a}Bi_{1-b}Sn_b$ crystalline substance is obtained in the range of a and b described above, all the substances belonging to the range do not necessarily have a high figure of merit ZT.
(Method for Calculating Figure of Merit of Thermoelectric Conversion)

The thermoelectric conversion efficiency is determined by the figure of merit ZT of a material. The ZT is defined by the following relational expression (8):

$$ZT=S^2\sigma T/(\kappa_e+\kappa_{lat}) \quad (8)$$

where S is the Seebeck coefficient, σ is the electrical conductivity, T is the absolute temperature in the evaluation environment, $\kappa_e$ is the electron thermal conductivity, and $\kappa_{lat}$ is the lattice thermal conductivity. Regarding S, a, and ice, the VASP code and the BoltzTraP code (refer to Non-patent Literature 4: G. K. H. Madsen et al., "BoltzTraP. A code for calculating band-structure dependent quantities", Computer Physics Communications, Volume 175, p. 67-71, (2006)) were used, and evaluations based on the Boltzmann transport theory were made. The electron relaxation time r, which is a parameter for determining a, was calculated by simultaneously solving the following relational expression (9) regarding the mobility p and the theoretical formula (10) disclosed in Non-patent Literature 5 (H. Wang et al., in Thermoelectric Nanomaterials, ed. K. Koumoto and T. Mor, Springer, Berlin Heidelberg, vol. 182, ch. 1, p. 3-32, (2013)):

$$\mu=e\tau/m^* \quad (9)$$

$$\mu=(8\pi)^{1/2}(h/2\pi)^4 eB/3m^{*5/2}(k_b T)^{3/2}g^2 \quad (10)$$

where e is the elementary charge, m* is the effective mass of carrier, B is the elastic constant, and g is the deformation potential. The values of m*, B, and g were calculated by the density functional theory using the VASP code. The value of g was calculated by the relational expression g=−Δε/(ΔI/I) disclosed in Non-patent Literature 6 (J. Chen et al., "First-Principles Predictions of Thermoelectric Figure of Merit for Organic Materials: Deformation Potential Approximation", Journal of Chemical Theory and Computation, 8, p. 3338-3347, (2012)), where A is the amount of change in the energy level of the band edge when the lattice constant I is changed by ΔI.

The lattice thermal conductivity was calculated using the following empirical formula (11) based on the Debye-Callaway model disclosed in Non-patent Literature 7 (J. Yang et al., "Material descriptors for predicting thermoelectric performance", Energy & Environmental Science, 8, p. 983-994, (2015)):

$$\kappa_L=A_1 Mv^3/V^{2/3}n^{1/3}+A_2 v/V^{2/3}(1-1/n^{2/3}) \quad (11)$$

where M is the average atomic mass, v is the longitudinal acoustic wave velocity, V is the volume per one atom, and n is the number of atoms in a unit cell. In the calculation, the values $A_1$ and $A_2$ disclosed in Non-patent Literature 5 were used.
(Calculation Results of Figure of Merit)

In the range in which the BiF-type crystal structure of $Li_{3-a}Bi_{1-b}Sn_b$ is most stable obtained by the method described above, the present inventors evaluated thermoelectric conversion characteristics. Table 1 shows prediction results of thermoelectric conversion characteristics at 300 K in Examples 1 to 10, Comparative Examples 1 to 3, and Reference Examples 1 to 4.

TABLE 1

|  | a | b | S (μV/K) | σ (S/cm) | κ (W/mK) | ZT |
|---|---|---|---|---|---|---|
| Reference Example 1 | 0.0003 | 0 | 572 | 15 | 0.33 | 0.44 |
| Reference Example 2 | 0.004 | 0 | 343 | 215 | 0.47 | 1.61 |
| Reference Example 3 | 0.016 | 0 | 238 | 783 | 0.89 | 1.50 |
| Reference Example 4 | 0.085 | 0 | 119 | 4182 | 3.38 | 0.57 |
| Example 1 | 0 | 0.0003 | 563 | 16 | 0.33 | 0.47 |
| Example 2 | 0 | 0.003 | 372 | 150 | 0.43 | 1.47 |
| Example 3 | 0 | 0.016 | 237 | 791 | 0.89 | 1.49 |
| Example 4 | 0.0001 | 0.0002 | 577 | 14 | 0.33 | 0.42 |
| Example 5 | 0.0003 | 0.016 | 240 | 760 | 0.87 | 1.51 |
| Example 6 | 0.001 | 0.003 | 348 | 202 | 0.46 | 1.59 |
| Example 7 | 0.012 | 0.004 | 221 | 968 | 1.02 | 1.39 |
| Example 8 | 0.012 | 0.008 | 220 | 981 | 1.08 | 1.38 |
| Example 9 | 0.030 | 0.003 | 186 | 1554 | 1.45 | 1.11 |
| Example 10 | 0.085 | 0.0001 | 119 | 4184 | 3.38 | 0.53 |
| Comparative Example 1 | 0 | 0 | 670 | 1.1 | 0.32 | 0.05 |
| Comparative Example 2 | 0.654 | 0 | 34 | 32206 | 23.9 | 0.05 |
| Comparative Example 3 | 0.0001 | 0.0001 | 597 | 11 | 0.32 | 0.36 |

The material of Comparative Example 1 is a $Li_3Bi$ crystalline substance without defect.

The materials of Reference Examples 1 to 4 and Comparative Example 2 are $Li_{3-a}Bi$ crystalline substances which are made deficient of Li.

The materials of Examples 1 to 3 are $Li_3Bi_{1-b}Sn_b$ crystalline substances in which Bi is substituted by Sn.

The materials of Examples 4 to 10 and Comparative Example 3 are $Li_{3-a}Bi_{1-b}Sn_b$ crystalline substances which are made deficient of Li and in which Bi is substituted by Sn.

As shown in Table 1, in Reference Examples 1 to 4, in the composition range of 0.0003≤a≤0.085, p-type characteristics with a positive S value were obtained, and a high ZT of 0.44 or more, greatly higher than that of Comparative Examples 1 to 3, was obtained.

In Examples 1 to 3, in the composition range of 0.0003≤b≤0.016, p-type characteristics with a positive S value were obtained, and a high ZT of 0.47 or more, greatly higher than that of Comparative Examples 1 to 3, was obtained.

In Examples 4 to 10, under the compositional conditions of 0.0001≤a≤0.085, and 0.0001≤b≤0.016, p-type characteristics with a positive S value were obtained, and a high ZT of 0.42 or more, greatly higher than that of Comparative Examples 1 to 3, was obtained.

The ZT values of the materials of Reference Examples 1 to 4 and Examples 1 to 10 were each higher than 0.4 at 300 K. Therefore, the present inventors consider that the thermoelectric conversion materials according to the present disclosure are useful in thermoelectric power generation in the low-temperature range of 200° C. or lower.

Figure 3:
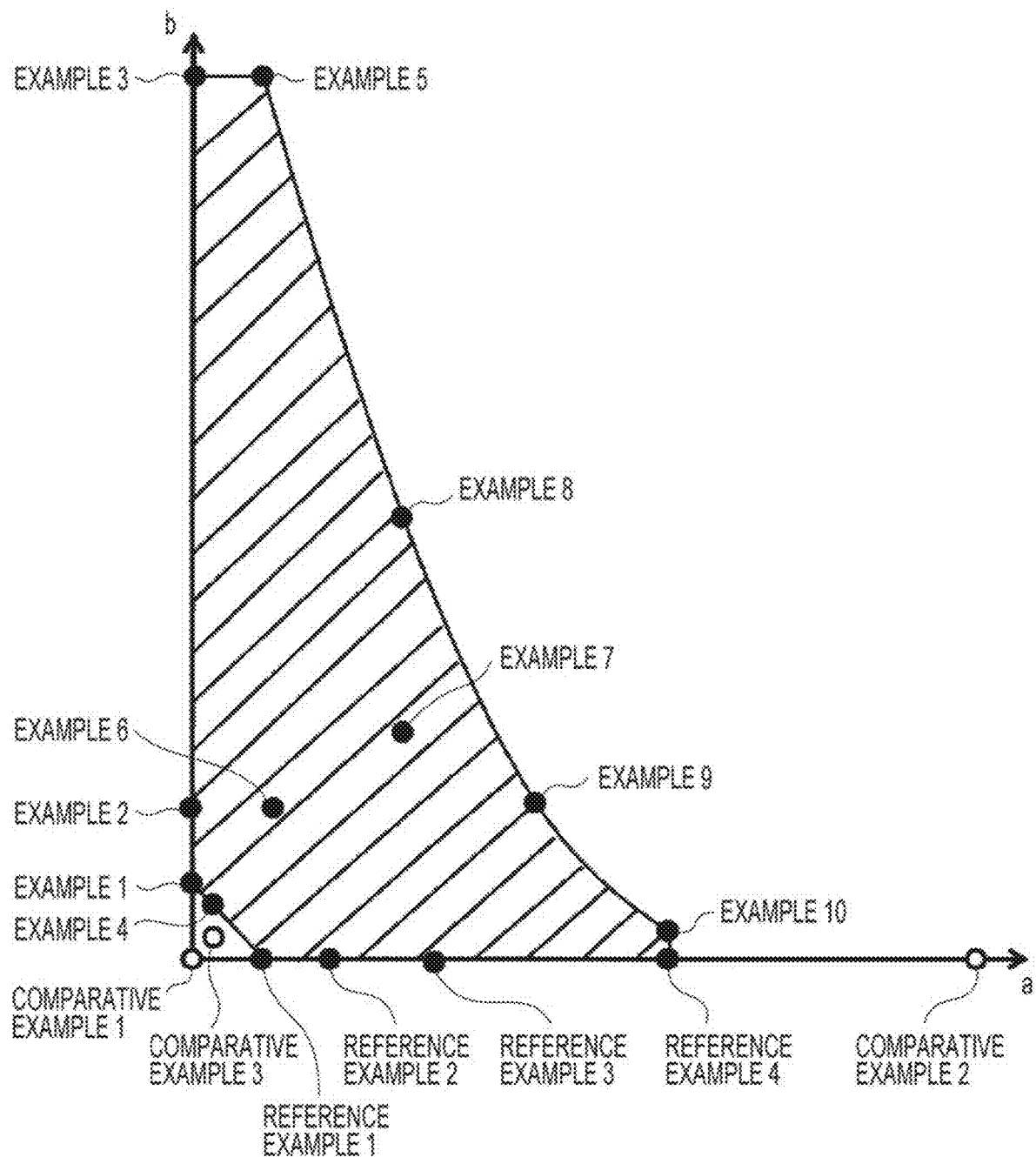
FIG. 3 is a graph in which points representing Examples 1 to 10, Comparative Examples 1 to 3, and Reference Examples 1 to 4 are plotted on the a-b plane.

FIG. 3 is a graph in which points representing Examples 1 to 10, Comparative Examples 1 to 3, and Reference Examples 1 to 4 are plotted on the a-b plane.

The curve passing through the four points representing Examples 5, 8, 9, and 10 shown in FIG. 3 (i.e., (a, b)= (0.0003, 0.016), (0.012, 0.008), (0.030, 0.003), and (0.085, 0.0001)) is represented by the formula: $b=\exp[-0.079\times(\ln(a))^2-1.43\times\ln(a)-10.5]$.

The straight line passing through the three points representing Reference Example 1, Example 1, and Example 4 (i.e., (a, b)=(0.0003, 0), (0, 0.0003), and (0.0001, 0.0002)) is represented by the formula: $b=-a+0.0003$.

The shaded area shown in FIG. 3 is a region surrounded by the following two formulas (I) and (II): 0≤a≤0.0003, and $-a+0.0003 \le b \le 0.016$ (I); and 0.0003≤a≤0.085, and $0 \le b \le \exp[-0.079\times(\ln(a))^2-1.43\times\ln(a)-10.5]$ (II).

The thermoelectric conversion material according to the present disclosure can be used in a thermoelectric conversion device which converts heat energy into electrical energy.

What is claimed is:

1. A thermoelectric conversion material comprising a composition represented by the chemical formula $Li_{3-a}Bi_{1-b}Sn_b$, wherein:
    the thermoelectric conversion material has a crystal structure same as $BiF_3$, and has a p-type polarity, and
    one of the following formulas (I) and (II) is satisfied:
    0≤a<0.0003, and $-a+0.0003 \le b \le 0.016$ (I); and
    0.0003≤a≤0.085, and $0<b \le \exp[-0.079\times(\ln(a))^2-1.43\times\ln(a)-10.5]$ (II).

2. The thermoelectric conversion material according to claim 1, wherein a=0, and 0.0003≤b≤0.016.

3. A method of obtaining electrical power using a thermoelectric conversion material, the method comprising:
    applying a temperature difference to the thermoelectric conversion material to generate the electrical power, wherein:
    the thermoelectric conversion material has a composition represented by the chemical formula $Li_{3-a}Bi_{1-b}Sn_b$, has a crystal structure same as $BiF_3$, and has a p-type polarity, and
    one of the following formulas (I) and (II) is satisfied:
    0≤a<0.0003, and $-a+0.0003 \le b \le 0.016$ (I); and
    0.0003≤a≤0.085, and $0<b \le \exp[-0.079\times(\ln(a))^2-1.43\times\ln(a)-10.5]$ (II).

* * * * *